United States Patent
Tao et al.

(10) Patent No.: US 12,142,699 B1
(45) Date of Patent: Nov. 12, 2024

(54) SOLAR CELL AND PHOTOVOLTAIC MODULE

(71) Applicant: ZHEJIANG JINKO SOLAR CO., LTD., Zhejiang (CN)

(72) Inventors: Wusong Tao, Zhejiang (CN);
Zhendong Chen, Zhejiang (CN);
Luchuang Wang, Zhejiang (CN);
Changchun Peng, Zhejiang (CN); Chi Zhang, Zhejiang (CN)

(73) Assignee: ZHEJIANG JINKO SOLAR CO., LTD., Haining Zhejiang (CN)

( * ) Notice: Subject to any disclaimer, the term of this patent is extended or adjusted under 35 U.S.C. 154(b) by 0 days.

(21) Appl. No.: 18/401,297

(22) Filed: Dec. 29, 2023

(30) Foreign Application Priority Data

Nov. 16, 2023 (CN) .......................... 202311526407.3

(51) Int. Cl.
*H01L 31/0224* (2006.01)
*H01L 31/048* (2014.01)

(52) U.S. Cl.
CPC .... *H01L 31/022433* (2013.01); *H01L 31/048* (2013.01)

(58) Field of Classification Search
CPC ..... H01L 31/022441; H01L 31/022425; H01L 31/022433; H01L 31/048; H01L 31/05
See application file for complete search history.

(56) References Cited

U.S. PATENT DOCUMENTS

| | | | |
|---|---|---|---|
| 2016/0005905 A1 | 1/2016 | Jang et al. | |
| 2016/0284893 A1* | 9/2016 | Teramura | H01L 31/022433 |
| 2020/0111927 A1* | 4/2020 | Lee | H01L 31/022433 |
| 2022/0302327 A1* | 9/2022 | Geissler | H01L 31/022433 |

(Continued)

FOREIGN PATENT DOCUMENTS

| | | |
|---|---|---|
| CN | 204966514 U | 1/2016 |
| CN | 106206768 A | 12/2016 |
| CN | 206432271 U | 8/2017 |

(Continued)

OTHER PUBLICATIONS

WO-2017026016-A1 English machine translation (Year: 2017).*

(Continued)

*Primary Examiner* — Andrew J Golden
(74) *Attorney, Agent, or Firm* — USCH Law, PC

(57) ABSTRACT

The solar cell includes a substrate having a central region and two peripheral regions. The solar cell further includes multiple finger electrodes arranged at intervals along the first direction, and the multiple finger electrodes include multiple first finger electrodes and multiple second finger electrodes. Each of the multiple first finger electrodes includes first body portions and first widened portions arranged alternatingly along the second direction, each of the multiple second finger electrodes includes second body portions and second widened portions arranged alternatingly along the second direction, and the first widened portions are arranged and aligned to the second widened portions. A respective first widened portion of a respective first finger electrode in two first finger electrodes farthest from the central region on the substrate has a larger orthographic projection than a respective first widened portion of each of two first finger electrodes closest to the central region.

18 Claims, 7 Drawing Sheets

(56) References Cited

U.S. PATENT DOCUMENTS

2023/0343878 A1    10/2023   Huang et al.

FOREIGN PATENT DOCUMENTS

| CN | 209708990 U | | 11/2019 | | |
|---|---|---|---|---|---|
| CN | 209993604 U | | 1/2020 | | |
| CN | 115172485 A | | 10/2022 | | |
| CN | 116646409 A | | 8/2023 | | |
| DE | 202023104601 U1 | * | 10/2023 | ..... | H01L 31/022433 |
| JP | 2018056563 A | | 4/2018 | | |
| JP | 2018160662 A | | 10/2018 | | |
| JP | 2020047925 A | | 3/2020 | | |
| JP | 2020061551 A | | 4/2020 | | |
| WO | 2010116914 A1 | | 10/2010 | | |
| WO | WO-2017026016 A1 | * | 2/2017 | ..... | H01L 31/022433 |
| WO | 2023280308 A1 | | 1/2023 | | |

OTHER PUBLICATIONS

DE-202023104601-U1 English machine translation (Year: 2023).*
Zhejiang Jinko Solar Co., Ltd., CN first office action with English translation, CN 202311526407.3, Dec. 26, 2023, 18 pgs.

* cited by examiner

SOLAR CELL AND PHOTOVOLTAIC MODULE

CROSS-REFERENCE TO RELATED APPLICATION

The present application claims the benefit of priority under the Paris Convention to Chinese Patent Application No. 202311526407.3 filed on Nov. 16, 2023, which is incorporated herein by reference in its entirety.

TECHNICAL FIELD

Embodiments of the present application relate to the technical field of photovoltaics, and in particular to a solar cell and a photovoltaic module.

BACKGROUND

Fossil energy has air pollution and limited reserves, while solar energy has advantages such as cleanliness, pollution-free, and abundant resources. Therefore, solar energy is gradually becoming the core clean energy to replace fossil energy. Due to the desirable photovoltaic conversion efficiency, the solar cell has become the development focus of clean energy utilization.

A photovoltaic module is one of the important components of solar power generation device. The sunlight irradiates on a front surface of the solar cell, which includes a substrate of the solar cell substrate and grid lines arranged on the front surface of the substrate. The development of the grid lines from a small number of busbars with a large size to a large number of busbars with and a small size, and finally to no busbar at all.

SUMMARY

The embodiments of the present application provide a solar cell and a photovoltaic module, which are at least beneficial for increasing the welding area of the solar cell.

According to some embodiments of the present application, in a first aspect, a solar cell is provided according to the present application, and the solar cell includes: a substrate having a central region and two peripheral regions on two opposite sides of the central region, respectively. The solar cell further includes multiple finger electrodes arranged at intervals along a first direction, and the multiple finger electrodes includes first finger electrodes and second finger electrodes, each of the two peripheral regions has at least one first finger electrodes in the first finger electrodes, and the second finger electrodes are arranged in the central region, wherein the multiple finger electrodes are arranged on a surface of the substrate and each of the multiple finger electrodes extends along a second direction. A respective first finger electrode of the first finger electrodes includes first body portions and first widened portions arranged alternatingly along the second direction, a respective second finger electrode of the second finger electrodes includes second body portions and second widened portions arranged alternatingly along the second direction, and the first widened portions are respectively aligned to the second widened portions. Each of the first widened portion has a larger orthographic projection on the substrate than each of the second widened portions, each of the first widened portions has a larger orthographic projection on the substrate than each of the first body portions, each of the second widened portions has a larger orthographic projection on the substrate than each of the second body portions, and along the first direction, a respective first widened portion of either one of two first finger electrodes farthest from the central region has a larger orthographic projection than a respective first widened portion of each of two first finger electrodes closest to the central region.

In some embodiments, at least one of the first widened portions in a same column of the columns gradually increases in orthographic projection area on the substrate along the first direction or a direction opposite to the first direction.

In some embodiments, along the first direction or a direction opposite to the first direction, different first widened portions in a same column of the columns gradually increases in size along the first direction, and/or different first widened portions in the same column of the columns gradually increases in size along the second direction.

In some embodiments, along the first direction or a direction opposite to the first direction, different first widened portions in a same column of the columns have a same size along the second direction, and/or different second widened portions in the same column of the columns have a same size along the second direction.

In some embodiments, a respective first widened portion and a respective second widened portion in the same column of the columns have a same size along the first direction.

In some embodiments, a respective peripheral region in the two peripheral regions includes a first sub region and two second sub regions arranged on two opposite sides of the first sub region along the second direction, respectively, and a respective first widened portion in the first sub region is smaller than a respective first widened portion in the two second sub regions in average area.

In some embodiments, at least one of the first widened portions of a same first finger electrode in the two second sub regions gradually increases in size along the second direction or a direction opposite to the second direction.

In some embodiments, the first body portions have a same size as the second body portions.

In some embodiments, at least one the first body portions in a same column of the columns gradually increases in size along the first direction or a direction opposite to the first direction.

In some embodiments, the first widened portions and/or the second widened portions have a rectangular shaped, an elliptical shaped, or a wave shaped orthographic projections on the substrate.

In some embodiments, there are 2 to 10 first finger electrodes on one each of the two peripheral regions.

According to some embodiments of the present application, in a second aspect, a photovoltaic module is further provided according to the present application, and the photovoltaic module includes: a cell string including edge cells arranged close to edges of the photovoltaic module and a central cell, each of the edge cells includes a substrate having a central region and two peripheral regions on two opposite sides of the central region, respectively. The solar cell further includes multiple finger electrodes arranged at intervals along a first direction, and the multiple finger electrodes includes first finger electrodes and second finger electrodes, each of the two peripheral regions has at least one first finger electrode in the first finger electrodes, and the second finger electrodes are arranged in the central region. The multiple finger electrodes are arranged on a surface of the substrate and each of the multiple finger electrodes extends along a second direction. A respective first finger electrode of the first finger electrodes includes first body portions and first widened portions arranged alternatingly along the second direction, a respective second finger electrode of the second finger electrodes includes second body portions and second widened portions arranged alternatingly along the second direction, and the first widened portions are respectively aligned to the second widened portions. Each of the first widened portions has a larger orthographic projection on the substrate than each of the second widened portion, each of the first widened portion have a larger orthographic projection on the substrate than each of the first body portions, each of the second widened portions has a larger orthographic projection on the substrate than each of the second body portions, and a respective first widened portion of either one of two first finger electrodes farthest from the central region has a larger orthographic projection than a respective first widened portion of each of two first finger electrodes closest to the central region. The photovoltaic module further includes welding strips arranged at intervals along the second direction and extending along the first direction, a respective welding strip in the multiple welding strips is in contact and connected to the first widened portions and the second widened portions in a same respective column to connect two adjacent cells. The photovoltaic module further includes at least one encapsulation adhesive film configured to cover the at least one cell string; and at least one cover plate configured to cover the at least one encapsulation adhesive film.

In some embodiments, each of the first widened portions of each respective first finger electrode of a respective edge cell closest to the central cell has a smaller orthographic projection on the substrate than each of the first widened portions of the first finger electrodes of a respective edge cell farthest away from the central cell.

In some embodiments, along the second direction or a direction opposite to the second direction, at least one of the first widened portions of each respective first finger electrode of a respective edge cell closest to the central cell has a larger orthographic projection on the substrate than some of the first widened portions in a same column of the columns along the first direction of each respective first finger electrodes of two edge cells closest to the central cell.

In some embodiments, any of the first widened portions of each respective first finger electrodes of a respective edge cell farthest from the central cell has a larger orthographic projection on the substrate than any of the first widened portions in a same column of the columns along the first direction of each respective first finger electrodes of a respective edge cell closest to the central cell.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated. For more clearly illustrating embodiments of the present application or the technical solutions in the conventional technology, drawings referred to for describing the embodiments or the conventional technology will be briefly described hereinafter. Apparently, drawings in the following description are only examples of the present application, and for the person skilled in the art, other drawings may be acquired based on the provided drawings without any creative efforts.

DETAILED DESCRIPTION

Figure 1:
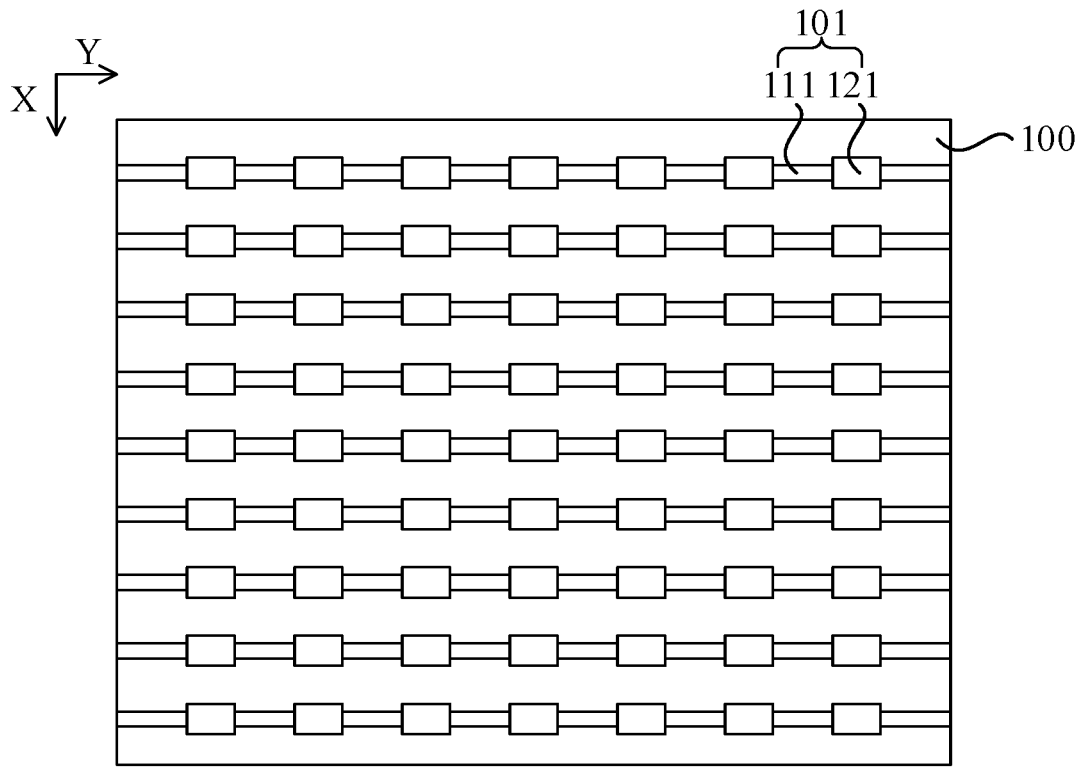
FIG. 1 is a top view of a first solar cell provided according to an embodiment of the present application.

FIG. 1 is a top view of a first solar cell provided according to an embodiment of the present application. Referring to FIG. 1, in some embodiments, the solar cell includes multiple finger electrodes 101 arranged at intervals along a first direction X. The finger electrodes 101 are arranged on a surface of the substrate 100 and each of the finger electrodes 101 extends along a second direction Y.

At present, in order to improve the reliability of connection between the welding strips and the finger electrodes 101, each finger electrode 101 including multiple body portions 111 and multiple widened portions 121 arranged alternatingly along the second direction Y. Among them, the widened portion 121 is a portion connected to the welding strip. However, when conducting reliability analysis on the connected photovoltaic modules, it was found that, the failure of the connection between the finger electrode 101 and the welding strip is prone to occur close to the edges of the substrate 100.

At least to solve the above problems, the embodiments of the present application provides a solar cell that additionally widens the widened portion 121 close to the edges of the substrate 100, such that the orthographic projections of the widened portions 121 close to the edges of the substrate 100 on the substrate 100 is larger than the orthographic projections of the widened portions 121 away from the edge of the substrate 100 on the substrate 100, thereby improving the reliability of the connection between the finger electrodes 101 and the welding strips.

Figure 2:
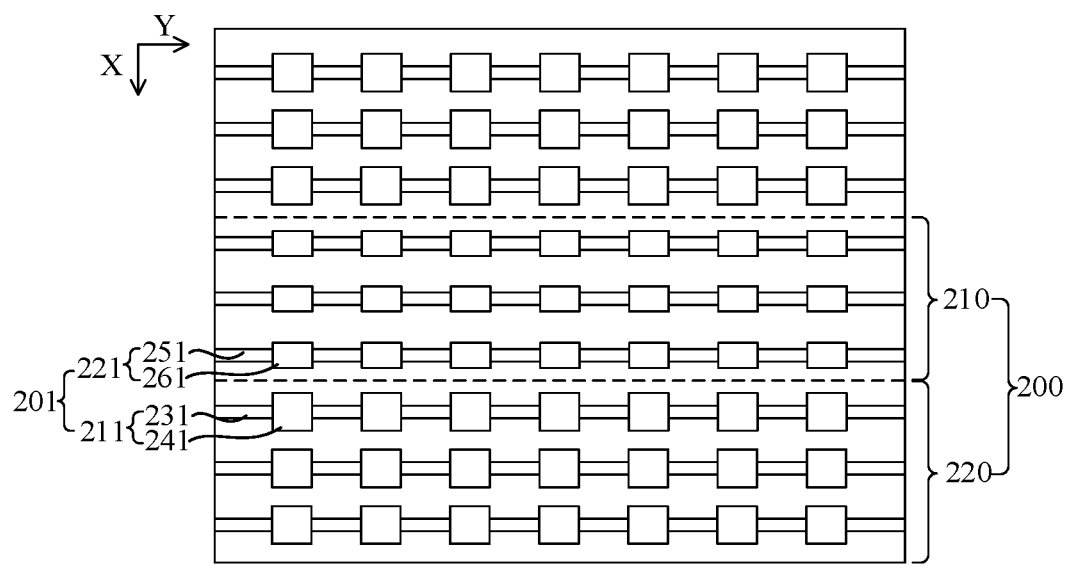
FIG. 2 is a top view of a second solar cell provided according to an embodiment of the present application.

FIG. 2 is a top view of a second solar cell provided according to an embodiment of the present application. Referring to FIG. 2, in some embodiments, the substrate 200 includes: a central region 210 and two peripheral regions 220 arranged on two opposite sides of the central region 210 along the first direction X, respectively. The finger electrodes 201 arranged in the peripheral region 220 is defined as the first finger electrode 211, and the finger electrodes 201 arranged in the central region 210 is defined as the second finger electrode 221. Each of the first finger electrodes 211 includes multiple first body portions 231 and multiple first widened portions 241 arranged alternatingly along the second direction Y. Each of the multiple second finger electrodes 221 includes multiple second body portions 251 and multiple second widened portions 261 arranged alternatingly along the second direction Y. The first widened portion 241 and the second widened portion 261 are arranged in columns along the first direction X, and the first widened portion 241 has a larger orthographic projection on the substrate 200 than the second widened portions 261 on the substrate 200. The first widened portion 241 has a larger orthographic projection on the substrate 200 than the first body portion 231 on the substrate 200, and the second widened portion 261 has a larger orthographic projection on the substrate 200 than the second body portion 251. Along the first direction X and the second direction Y, the first widened portions 241 have the orthographic projections with the same area, the size of different first widened portions 241 along the first direction X is the same, the size of different first widened portions 241 along the second direction Y is also the same.

By setting the first widened portion 241 of the first finger electrode 211 arranged in the peripheral region 220 to have larger orthographic projections on the substrate 200 than the second widened portion 261, the reliability of the connection between the first finger electrode 211 arranged in the peripheral region 220 and the welding strip can be improved, thereby improving the reliability of the photovoltaic module formed subsequent.

Figure 3:
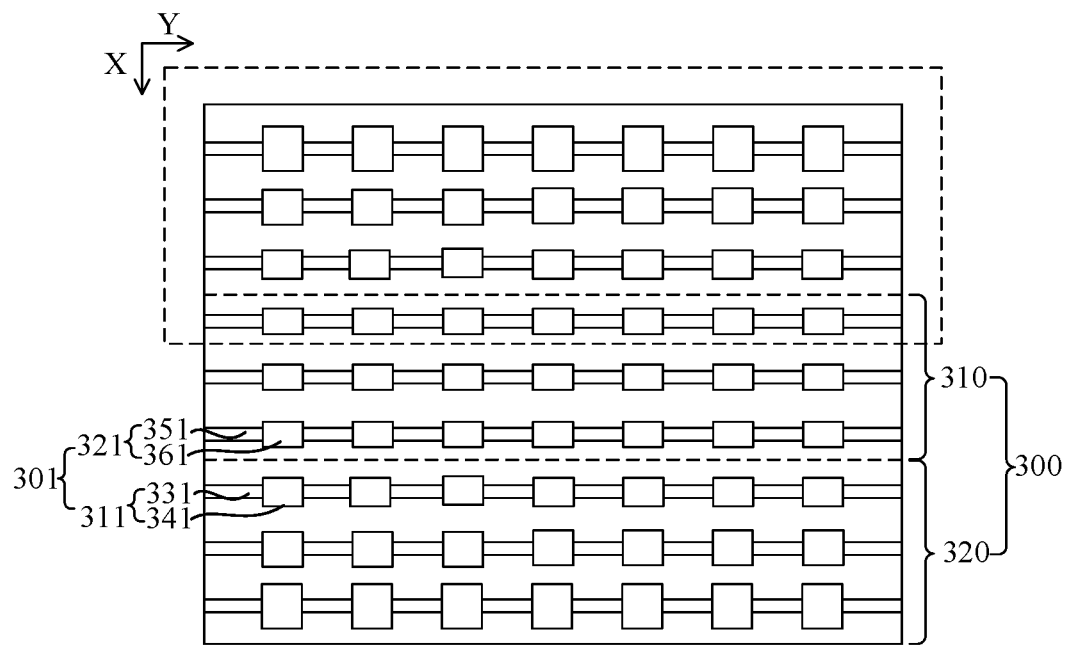
FIG. 3 is a top view of a third solar cell provided according to an embodiment of the present application.

Referring to FIG. 3, which is a top view of a third solar cell provided according to an embodiment of the present application.

In some embodiments, the solar cell provided according to the embodiments of the present application includes a substrate 300, which includes a central region 310 and peripheral regions 320 arranged on two opposite sides of the central region 310 along the first direction X, respectively.

The solar cell further includes multiple finger electrodes 301 arranged on a surface of the substrate 300 and extend along a second direction Y, and the multiple finger electrodes 301 include multiple first finger electrodes 311 and multiple second finger electrodes 321, each of the two peripheral regions 320 has at least one first finger electrodes 311, and the multiple second finger electrodes 321 are arranged in the central region 310. A respective first finger electrode 311 of the multiple first finger electrodes 311 includes first body portions 331 and first widened portions 341 arranged alternatingly along the second direction Y, a respective second finger electrode 321 of the multiple second finger electrodes 321 includes second body portions 351 and second widened portions 361 arranged alternatingly along the second direction Y. The first widened portions 341 are arranged and aligned to the second widened portions 361 along the first direction X.

Each of the first widened portions 341 has a larger orthographic projection on the substrate 300 than each of the second widened portion 361, each of the first widened portions 341 has a larger orthographic projection on the substrate 300 than each of the first body portions 331, each of the second widened portions 361 has a larger orthographic projection on the substrate than each of the second body portions 351, and along the first direction, a respective first widened portion 341 of a respective first finger electrode 311 in two first finger electrodes 311 farthest from the central region 310 on the substrate 300 has a larger orthographic projection than a respective first widened portion 341 of each of two first finger electrode 311 closest to the central region 310.

Specifically, as shown in FIG. 3, there are two peripheral regions 320 arranged on two sides of the central region 310 along the first direction X, respectively. Therefore, there are two first finger electrodes 311 closest to the central region 310 along the first direction X, and the two first finger electrodes 311 closest to the central region 310 are arranged in the two peripheral region 320, respectively. Similarly, there are two first finger electrodes farthest from the central region 310 along the first direction X, and the two first finger electrodes 311 farthest from the central region 310 are arranged in the two peripheral region 320, respectively.

In the solar cell provided according to the embodiments of the present application, the first finger electrode 311 includes first body portions 341 and first widened portions 331 arranged alternatingly along the second direction Y. The first widened portion 341 refers to a part where the solar cell is connected to the welding strip corresponding to a cell string when connecting the solar cell to form the cell string. By arranging the orthographic projections of the first widened portion 341 on the substrate 300 to be larger than the orthographic projections of the first body portion 331 on the substrate, the reliability of the connection between the first finger electrode 311 and the welding strip can be increased. Similarly, for the second finger electrode 321, the second widened portion 361 can also increase the reliability of the connection between the second finger electrode 321 and the welding strip. Moreover, for the solar cell, the probability of failure between the first finger electrode 311 arranged in the peripheral region 320 and the welding strip is greater than that of failure between the second finger electrode 321 arranged in the central region 310 and the welding strip. Therefore, it is also set that the orthographic projections of the first widened portion 341 on the substrate 300 is larger than the orthographic projections of the second widened portion 361, which can further improve the reliability of the connection between the first finger electrode 311 arranged in the peripheral region 320 and the welding strip. In addition, the probability of failure in the connection between the first finger electrode 311 farthest from the central region 310 and the welding strip is greater than that of the connection between the first finger electrode 311 closest to the central region 310 and the welding strip. Therefore, it is also set that the orthographic projections of the first widened portion 341 of the first finger electrode 311 farthest from the central region 310 on the substrate 300 is larger than the orthographic projections of the first widened portion 341 of the first finger electrode 311 closest to the central region 310 on the substrate 300, which can further improve the reliability of the connection between the solar cell and the welding strip.

In some embodiments, the substrate 300 is a substrate 300 that has already formed a partial structure of the solar cell. The tunnel oxide passivated contact (TOPcon) solar cell is taken as an example, a tunneling layer, a doped conductive layer, a passivation layer, and other film layers are already formed on the substrate 300. The substrate 300 may also be other types of solar cell structures, for example, a heterojunction cell or a busbar-free cell, etc.

In some embodiments, the central region 310 and the two peripheral regions 320 are divisions of the substrate 300. For example, the central region 310 and two peripheral regions 320 are three parts of the substrate 300 along the first direction X, with the middle part referred to as the central region 310 and other two parts referred to as the peripheral regions 320, and a ratio of the volume of any peripheral region 320 of the substrate 300 to the volume of the substrate 300 is less than or equal to ⅓. In other words, a ratio of the area of any peripheral region 320 of the substrate 300 on the top surface of the substrate 300 to the top surface of the substrate 300 is less than or equal to ⅓.

In some embodiments, the size of the first widened portion 341 and the second widened portion 361 along the second direction Y can be greater than the size of the welding strip along the second direction Y. On the one hand, it can facilitate the alignment of the welding strip with the first widened portions 341 and the second widened portions 361. On the other hand, there may be lamination and other processes during the formation of the photovoltaic module, which may cause deformation of the welding strip. By setting the size of the first widened portion 341 and the second widened portion 361 along the second direction Y to be greater than the size of the welding strip, a region to be in contact with the welding strip can be reserved.

In some embodiments, the first widened portions 341 and the first body portions 331 can be integrally formed, in other words, the first widened portions 341 and the first body portions 331 are formed in the same process step by using the same slurry. In some embodiments, the first widened portions 341 and the first body portions 331 are two interconnected structures. In other words, the first widened portions 341 and the first body portions 331 are formed in different process steps by using the same or different slurries.

Figure 4:
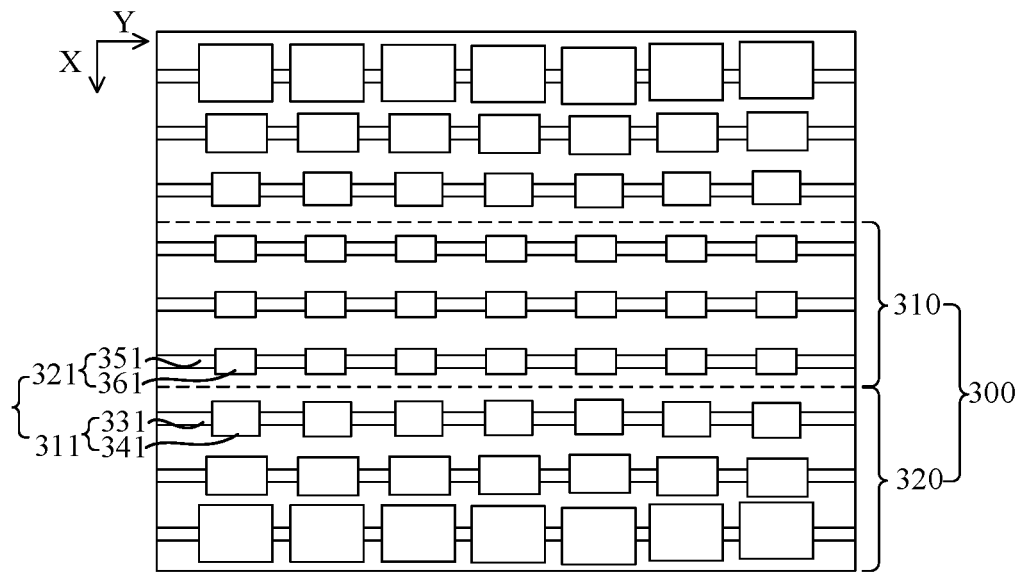
FIG. 4 is a top view of a fourth solar cell provided according to an embodiment of the present application.
Figure 5:
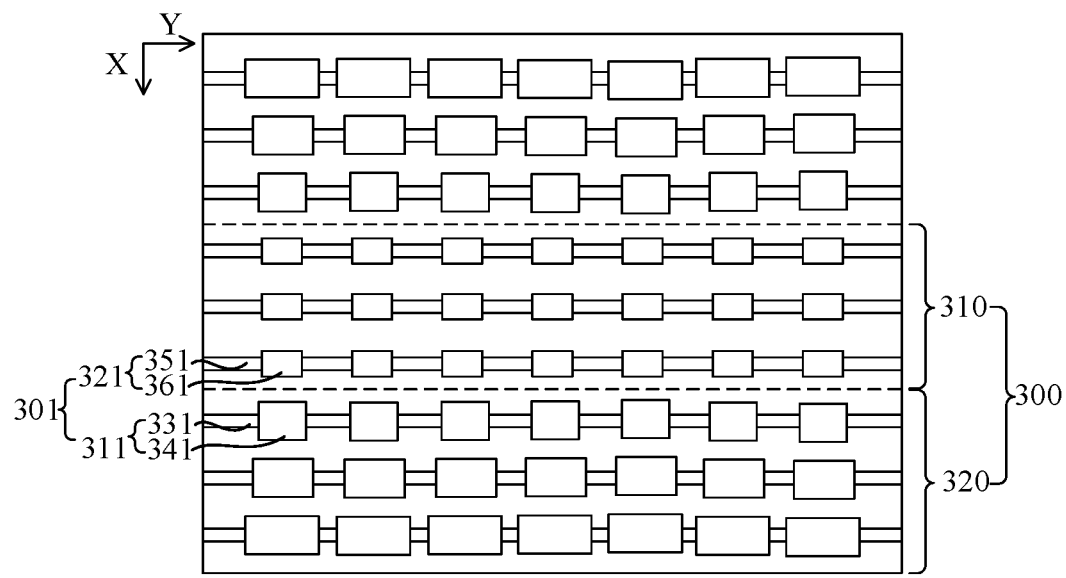
FIG. 5 is a top view of a fifth solar cell provided according to an embodiment of the present application.
Figure 6:
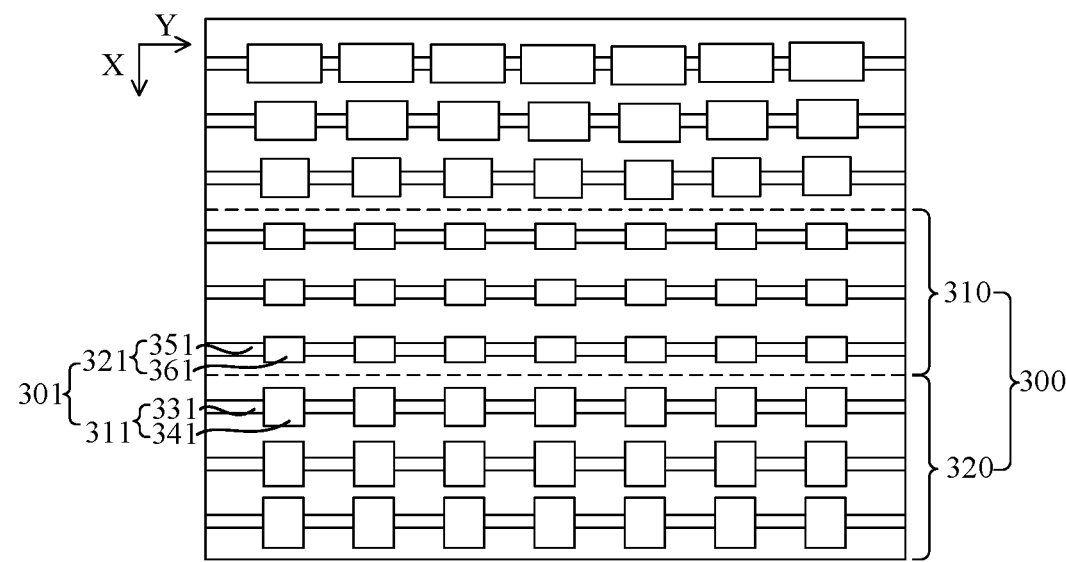
FIG. 6 is a top view of a sixth solar cell provided according to an embodiment of the present application.

Referring to FIG. 3 to FIG. 6, FIG. 3 is a top view of a third solar cell provided according to an embodiment of the present application. FIG. 4 is a top view of a fourth solar cell provided according to an embodiment of the present application. FIG. 5 is a top view of a fifth solar cell provided according to an embodiment of the present application. FIG. 6 is a top view of a sixth solar cell provided according to an embodiment of the present application.

In some embodiments, at least one of the first widened portions 341 in a same column of the columns gradually increases in orthographic projection area on the substrate 300 along the first direction X or a direction opposite to the first direction X.

Referring to FIG. 3, for example, the number of finger electrodes 301 included in FIG. 3 is 9. Among them, the number of second finger electrodes 321 in the central region 310 is 3, and the number of first finger electrodes 311 on one side of the second finger electrode 321 is 3. The three first finger electrodes 311 in one of the peripheral regions 320 are named as a first of first finger electrode, a second of first finger electrode, and a third of first finger electrode, respectively from the central region 310 to the peripheral region 320. Among them, at least one of the first widened portions 341 in a same column of the columns gradually increases in orthographic projection area on the substrate 300, which can refer to: the first widened portion 341 of the first of first finger electrode has a smaller orthographic projection area on the substrate 300 than the first widened portion 341 of the second of first finger electrode, and the first widened portion 341 of the second of first finger electrode has a smaller orthographic projection area on the substrate 300 than the first widened portion 341 of the third of first finger electrode. It can also refer to that the first widened portion 341 of the first of first finger electrode has a smaller orthographic projection area on the substrate 300 than the first widened portion 341 of the second of first finger electrode, and the first widened portion 341 of the second of first finger electrode has the same orthographic projection area on the substrate 300 than the first widened portion 341 of the third of first finger electrode. It can also refer to the first widened portion 341 of the first of first finger electrode has the same orthographic projection area on the substrate 300 than the first widened portion 341 of the second of first finger electrode, and the first widened portion 341 of the second of first finger electrode has a smaller orthographic projection area on the substrate 300 than the first widened portion 341 of the third of first finger electrode.

It should be noted that the number of the first finger electrode 311 on one side of the central region 310 being 3 is taken as an example in the above explanation, and the number of the first finger electrode 311 in the peripheral region 320 may also be other quantities. That is to say, there are more cases for the expression of at least one of the first widened portions 341 in a same column of the columns gradually increasing in orthographic projection area on the substrate 300.

It should be noted that the orthographic projection area of the first widened portion 341 of the first finger electrode 311 on the substrate 300 above refers to: in response to the number of first widened portions 341 being one, it refers to the area of this first widened portion 341, in response to the number of first widened portions 341 being multiple, the orthographic projection area of the first widened portion 341 of the first finger electrode 311 on the substrate 300 can refer to the orthographic projection area of any first widened portion 341 of the first finger electrode 311 on the substrate 300, or it can refer to the average orthographic projection area of the multiple first widened portions 341 of the first finger electrode 311 on the substrate 300.

In some embodiments, at least one of the first widened portions 341 in a same column of the columns may not gradually increases in orthographic projection area on the substrate 300 along the first direction X or a direction opposite to the first direction X, and the orthographic projection area may change irregularly. The number of the first finger electrodes 311 on one side of the central region 310 being 3 is taken as an example, the first widened portion 341 of the first of first finger electrode 311 on the substrate 300 has a larger orthographic projection area than the first widened portion 341 of the second of first finger electrode 311, and the first widened portion 341 of the third of first finger electrode 311 on the substrate 300 has a larger orthographic projection area than the first widened portion 341 of the first of first finger electrode 311.

In some embodiments, some of the first widened portions 341 in the same column of the columns have the same orthographic projection area on the substrate 300, and the morphological dimensions of these first widened portion 341 are the same. By setting some of the first widened portions 341 in the same column of the columns to have the same orthographic projection area on the substrate 300, and the morphological dimensions of these first widened portions 341 are the same, the process difficulty of forming the finger electrodes 301 can be reduced.

Continuing with reference to FIG. 3 to FIG. 5, in some embodiments, along the first direction X or a direction opposite to the first direction X, different first widened portions 341 in a same column of the columns gradually increases in size along the first direction X, and/or different first widened portions 341 in the same column of the columns gradually increases in size along the second direction Y. In other words, for the area parameter, the two factors that affect the area parameter are the size and size of the first widened portion 341. Therefore, by changing the size and/or size of different first widened portions 341 in the same column of the columns, the orthographic projection area of the first widened portions 341 in the same column of the columns on the substrate 300 can be adjusted.

Referring to FIG. 3 and FIG. 4, in some embodiments, along the first direction X or the direction opposite to the first direction X, the size of different first widened portions 341 in the same column of the columns along the first direction X gradually increases. At the same time, the size of different first widened portions 341 in the same column of the columns along the second direction Y can gradually increase, remain unchanged, or gradually decrease. Among them, FIG. 3 shows that the size of different first widened portions 341 in the same column of the columns gradually increases along the first direction X, while the size of different first widened portions 341 in the same column of the columns remains equal along the second direction Y. FIG. 4 shows that the size of different first widened portions 341 along the first direction X in the same column of the columns gradually increases, while the size of different first widened portions 341 along the second direction Y in the same column of the columns gradually increases.

As the size gradually increases, that is, the farther away from the central region 310, the larger the size of the first widened portion 341, which can improve the reliability of the connection between the first finger electrode 311 at the edges and the welding strip. The size remains unchanged, that is, the size of different first widened portions 341 in the same column of the columns is equal, which can simplify the process steps of forming the first finger electrode 311. As the size gradually decreases, that is, the farther away from the central region 310, the smaller the size of the first widened portion 341, which can balance the amount of slurry used.

In some embodiments, along the first direction X or the direction opposite to the first direction X, the size difference between two adjacent first widened portions 341 in the same column of the columns along the first direction X is less than or equal to 0.2 mm, such as 0.05 mm, 0.1 mm, or 0.15 mm. By setting the size difference between two adjacent first widened portions 341 in the same column of the columns along the first direction X to be less than or equal to 0.2 mm, the size difference between the adjacent first widened portions 341 can be reduced. On the one hand, it can improve the aesthetics of the solar cell, and on the other hand, it can avoid anomalies caused by excessive size differences between adjacent first widened portions 341.

In some embodiments, the maximum size of the first widened portion 341 farthest from the central region 310 along the second direction Y is 0.6 mm to 0.8 mm, such as 0.65 mm, 0.68 mm, or 0.75 mm, etc. It can be understood that in response to the maximum size of the first widened portion 341 farthest from the central region 310 along the second direction Y being less than 0.6 mm, the reliability of the connection between the first finger electrode 311 and the welding strip is improved. In response to the maximum size of the first widened portion 341 farthest from the central region 310 along the second direction Y being greater than 0.8 mm, it may cause the shading area of the first widened portion 341 to be too large, which may lead to a decrease in the photovoltaic conversion efficiency of the solar cell.

Referring to FIG. 4 and FIG. 5, in some embodiments, the size of different first widened portions 341 in the same column of the columns gradually increases along the second direction Y, and the size of different first widened portions 341 in the same column of the columns along the first direction X may gradually increase, remain unchanged, or gradually decrease. Among them, FIG. 4 shows that the size of different first widened portions 341 in the same column of the columns gradually increases along the second direction Y, and the size of different first widened portions 341 in the same column of the columns gradually increases along the first direction X. FIG. 5 shows that the size of different first widened portions 341 in the same column of the columns gradually increases along the second direction Y, and the size of different first widened portions 341 in the same column of the columns remains unchanged along the first direction X.

In some embodiments, along the first direction X or the direction opposite to the first direction X, the size difference between two adjacent first widened portions 341 in the same column of the columns along the second direction Y is less than or equal to 0.3 mm, such as 0.1 mm, 0.2 mm, or 0.25 mm, etc. By setting the size difference between two adjacent first widened portions 341 in the same column of the columns along the second direction Y to be less than or equal to 0.3 mm, the size difference between the two adjacent first widened portions 341 can be reduced. On the one hand, it can improve the aesthetics of the solar cell, and on the other hand, it can avoid anomalies caused by excessive size differences between adjacent first widened portions 341.

In some embodiments, the maximum size of the first widened portion 341 farthest from the central region 310 along the second direction Y is 1mm to 1.6 mm, such as 1.1 mm, 1.2 mm, or 1.4 mm, etc. It can be understood that in response to the maximum size of the first widened portion 341 farthest from the central region 310 along the second direction Y being less than 1 mm, the reliability of the connection between the first finger electrode 311 and the welding strip is improved. In response to the maximum size of the first widened portion 341 farthest from the central region 310 along the second direction Y being greater than 1.6 mm, it may cause the shading area of the first widened portion 341 to be too large, which may lead to a decrease in the photovoltaic conversion efficiency of the solar cell.

As the size gradually increases, that is, the farther away from the central region 310, the wider the first widened portion 341 becomes, which can improve the reliability of aligning the first finger electrode 311 at the edges with the welding strip. The size remains unchanged, that is, the size of different first widened portions 341 in the same column of the columns is equal, which can simplify the process steps of forming the first finger electrode 311. The size gradually decreases, that is, the farther away from the central region 310, the smaller the size of the first widened portion 341, which can balance the amount of slurry used.

It should be noted that for a regular shape, such as a rectangle, the size of the first widened portion 341 is the dimension along the first direction X, and the size is the dimension along the second direction Y. For irregular shapes, the size of the first widened portion 341 can be considered as the projection dimension of the two points with the longest distance along the first direction X of the first widened portion 341, the size can be considered as the projection dimension of the two points with the longest distance along the second direction Y of the first widened portion 341.

In some embodiments, the two peripheral regions 320 arranged on opposite sides of the central region 310 are symmetrically distributed. For example, the number of first finger electrodes 311 in each of the two peripheral regions 320 is 3. The first of first finger electrodes, the second of first finger electrodes, and the third of first finger electrodes in the two peripheral regions are the same. That is to say, the morphology and size of the first widened portion 341 and the first body portion 331 of the symmetrically distributed first finger electrode 311 are the same, which can reduce the process difficulty of the solar cell.

Referring to FIG. 6, in some embodiments, the peripheral regions 320 arranged on two opposite sides of the central region 310 are asymmetrically distributed. For example, the size of different first widened portions 341 in the same column of the columns of the peripheral region 320 arranged on one side of the central region 310 gradually increases along the first direction X, and the size of different first widened portions 341 in the same column of the columns of the peripheral region 320 arranged on the other side of the central region 310 gradually increases along the second direction Y.

Continuing with reference to FIG. 3, in some embodiments, along the first direction X or the direction opposite to the first direction X, the size of different first widened portions 341 in the same column of the columns along the second direction Y is equal, and/or the size of different second widened portions 361 in the same column of the columns along the second direction Y is equal. By setting the size of different first widened portions 341 in the same column of the columns to be equal along the second direction Y, the process difficulty of the solar cell can be reduced. Similarly, by setting the size of different second widened portions 361 in the same column of the columns to be equal along the second direction Y, the process difficulty of the solar cell can also be reduced.

Along the first direction X or the direction opposite to the first direction X, the size of different first widened portions 341 in the same column of the columns along the second direction Y is equal, and the size of different second widened portions 361 in the same column of the columns along the second direction Y may be equal, gradually decreases or gradually increases. FIG. 3 only show that the size of different first widened portions 341 in the same column of the columns is equal along the second direction Y, and the size of different second widened portions 361 in the same column of the columns is equal along the second direction Y. Along the first direction X or the direction opposite to the first direction X, the size of different second widened portions 361 in the same column of the columns along the second direction Y is equal, and the size of different first widened portions 341 in the same column of the columns along the second direction Y may be equal, gradually decreases or gradually increases.

It should be noted that the different first widened portions 341 in the same column of the columns refer to the different first widened portions 341 connected to the same welding strip in the future, and the different second widened portions 361 in the same column of the columns refer to the different second widened portions 361 connected to the same welding strip in the future.

Referring to FIG. 3, in some embodiments, the size of the first widened portion 341 in the same column of the columns is equal to the size of the second widened portion 361. In other words, the size of the first widened portion 341 and the second widened portion 361 connected to the same welding strip are both equal, which can also reduce the process difficulty of the solar cell.

Figure 7:
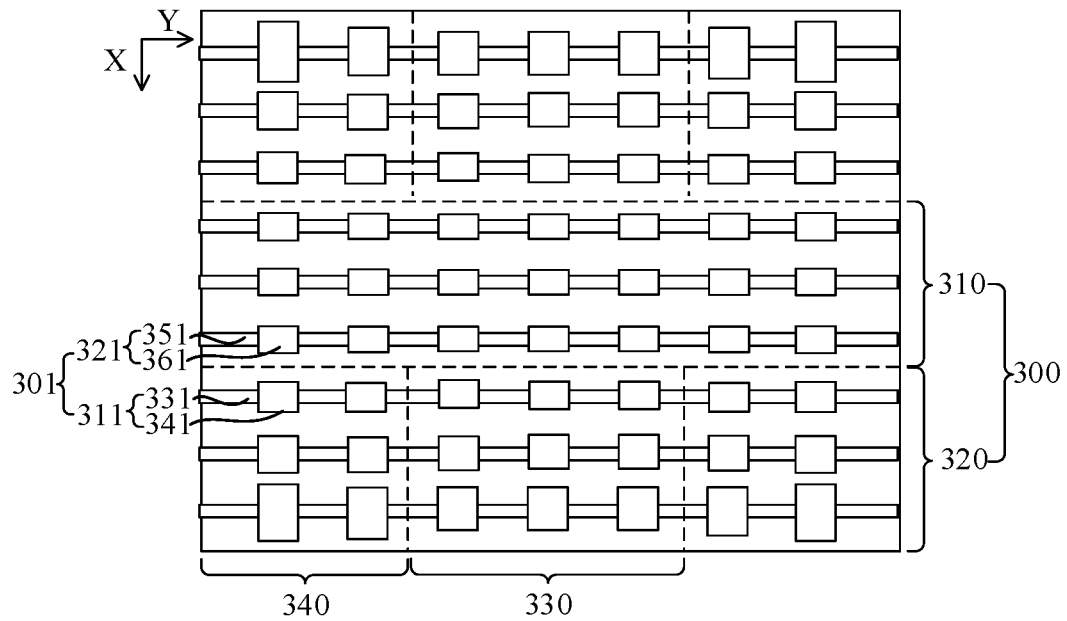
FIG. 7 is a top view of a seventh solar cell provided according to an embodiment of the present application.

Referring to FIG. 7, which is a top view of a seventh solar cell provided according to an embodiment of the present application. Each of the two peripheral regions 320 includes a first sub region 330 and a second sub region 340 arranged on opposite sides of the first sub region 330 along the second direction Y. The average surface area of the first widened portion 341 of the first sub region 330 is smaller than the average area of the first widened portion 341 of the second sub region 340. It can be understood that for the solar cell, the second sub region 340 is closer to the edge of the solar cell compared to the first sub region 330. Therefore, by setting the average area of the first widened portion 341 of the second sub region 340 to be greater than the average area of the first widened portion 341 of the first sub region 330, the reliability of the connection between the edge part of the solar cell and the welding strip can be further increased, thereby improving the reliability of the solar cell.

In some embodiments, the average area of the first widened portion 341 of the first sub region 330 is smaller than that of the first widened portion 341 of the second sub region 340. That is, each of the first widened portions 341 of the first sub region 330 has a smaller orthographic projection on the substrate than each of the first widened portion 341 of the second sub region 340, or it can be that each of the first widened portions 341 of the first sub region 330 has a smaller orthographic projection on the substrate than each of the first widened portions 341 of the second sub region 340.

Figure 8:
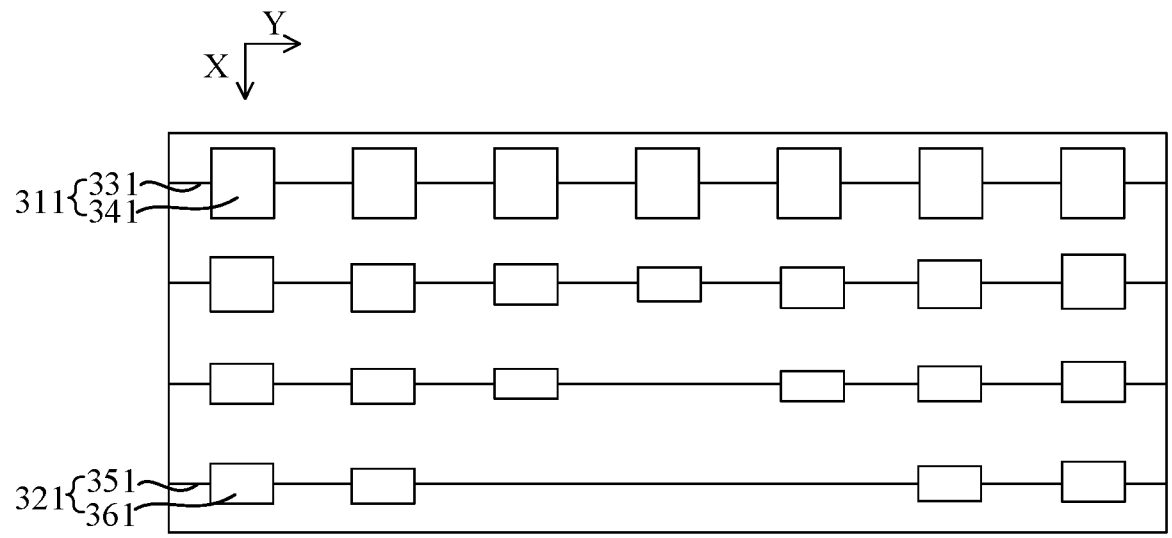
FIG. 8 is a top view of an eighth solar cell provided according to an embodiment of the present application.

It can be understood that for the first finger electrode 311, the first body portion 331 and the first widened portion 341 can be freely arranged. In other words, the size of the first body portion 331 along the second direction Y of different first finger electrodes 311 can be different. Referring to FIG. 8, which is an enlarged view of the dashed box in FIG. 3. It can be seen that there is a longest first body portion 331 in the first finger electrode 311 closest to the center area, in other words, the number of first widened portions 341 on the first finger electrode 311 closest to the center area is the smallest.

Continuing with reference to FIG. 7, in some embodiments, along the second direction Y or a direction opposite to the second direction Y, the size of at least a portion of the first widened portion 341 arranged on the same first finger electrode 311 in the second sub region 340 gradually increases. It can be understood that the greater the size, the stronger the reliability of connecting with the welding strip, and the more it is arranged at the edge of the solar cell, the stronger the reliability is required. Therefore, the size of at least a portion of the first widened portion 341 on the same first finger electrode 311 gradually increases, which can increase the reliability of connection with the welding strip at the edge of the solar cell.

In some embodiments, the gradual increase in size of at least one of the first widened portions 341 mentioned above can refer to the increase in size of all the first widened portions 341 arranged in the second sub region 340. For example, the number of first widened portions 341 arranged in the second sub region 340 in a first finger electrode 311 is 3. Among them, the 3 first widened portions 341 are sequentially named as a first of first widened portion, a second of first widened portion, and a third of first widened portion along the direction from the first sub region 330 towards the second sub region 340. The size of the first of first widened portion is smaller than that of the second first widened portion, and the size of the second of first widened portion is smaller than the size of the third of first widened portion. At least one of the first widened portions 341 gradually increases in size, which can also refer to only a part of the first widened portions 341 gradually increases in size. Similarly, the number of first widened portions 341 arranged in the second sub region 340 of a first finger electrode 311 being 3 is taken as an example, where the size of the first of first widened portion can be smaller than the size of the second of first widened portion, the size of the second of first widened portion can be equal to the size of the third of first widened portion, or the size of the first of first widened portion can be equal to the size of the second of first widened portion, and the size of the second of first widened portion can be smaller than the size of the third of first widened portion.

It should be noted that the above explanation takes the number of first widened portions 341 arranged in the second sub region 340 of a first finger electrode 311 being 3 as an example. The number of first widened portions 341 arranged in the second sub region 340 of a first finger electrode 311 may also be other quantities. That is to say, the size of at least one of the first widened portions 341 on the same first finger electrode 311 arranged in the second sub region 340 gradually increases, and there can be more arrangement options.

Figure 9:
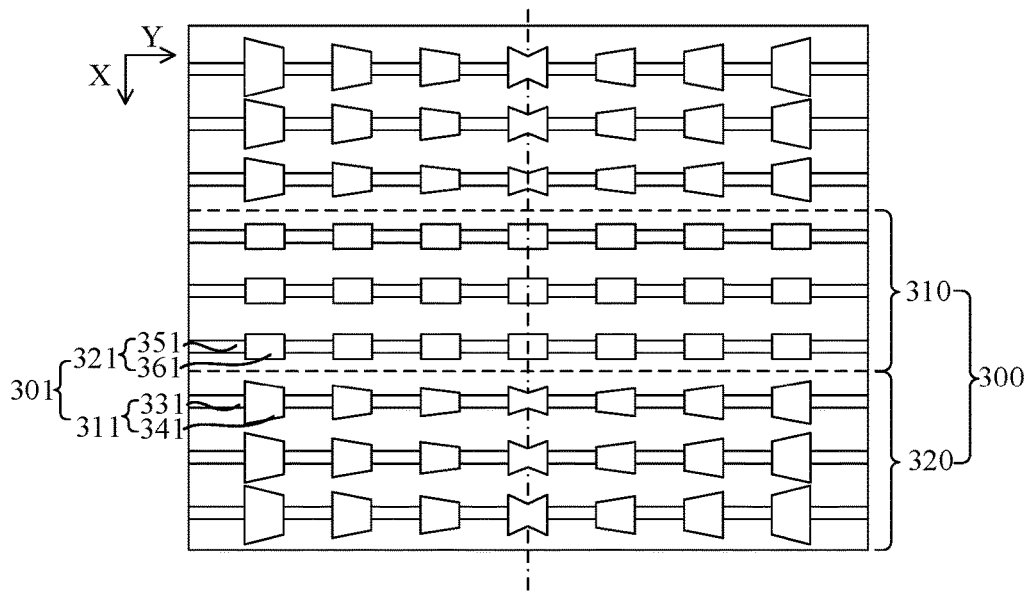
FIG. 9 is a top view of a ninth solar cell provided according to an embodiment of the present application.

Referring to FIG. 9, which is a top view of a ninth solar cell provided according to an embodiment of the present application. In some embodiments, the substrate 300 has a first axis parallel to the first direction X, and the substrate 300 is symmetrical along the first axis. For the same first widened portion 341, the size of a part away from the first axis is greater than the size of the part close to the first axis. In other words, for the first widened portion 341 on two sides of the first axis, the shape of the first widened portion 341 is a trapezoid rotated by 90 degrees, and for the first widened portion 341 arranged on the first axis, the shape of the first widened portion 341 is in a tie shape. It can be understood that the farther away from the first axis, the more it belongs to the edge part of the solar cell. Therefore, by setting the size of the part away from the first axis to be greater than the size of the part close to the first axis, the reliability of the solar cell can be further improved.

In some embodiments, the first widened portion 341 at different positions in the solar cell is asymmetric. The peripheral regions 320 arranged on two opposite sides of the central region 310 are taken as an example, the first widened portion 341 on the first finger electrode 311 closest to the central region in one peripheral region 320 may have a different morphology or size from the first widened portion 341 on the first finger electrode 311 closest to the central region 310 in another peripheral region 320. Alternatively, the peripheral region 320 includes the first sub region 330 and two second sub regions 340, where the morphology or size of the first widened portion 341 in a column closest to the first sub region 330 in one second sub region 340 and the first widened portion 341 in a column closest to the first sub region 330 in another second sub region 340 are different.

Referring to FIG. 3, in some embodiments, along the first direction X, the size of the first body portion 331 is the same as that of the second body portion 351. It can be understood that the first body portion 331 and the second body portion 351 are also arranged in columns along the first direction. Here, along the first direction X, the size of the first body portion 331 and the size of the second body portion 351 are the same, which means that in the same column of the columns, the size of the first body portion 331 and the second body portion 351 are the same.

In some embodiments, for the same first finger electrode 311, the size of all first body portions 331 on the same first finger electrode 311 is the same. Similarly, for the same second finger electrode 321, the size of all second body portions 351 on the same second finger electrode 321 is the same.

In some embodiments, for the convenience of the process, the size of all first body portions 331 and all second body portions 351 are the same.

Figure 10:
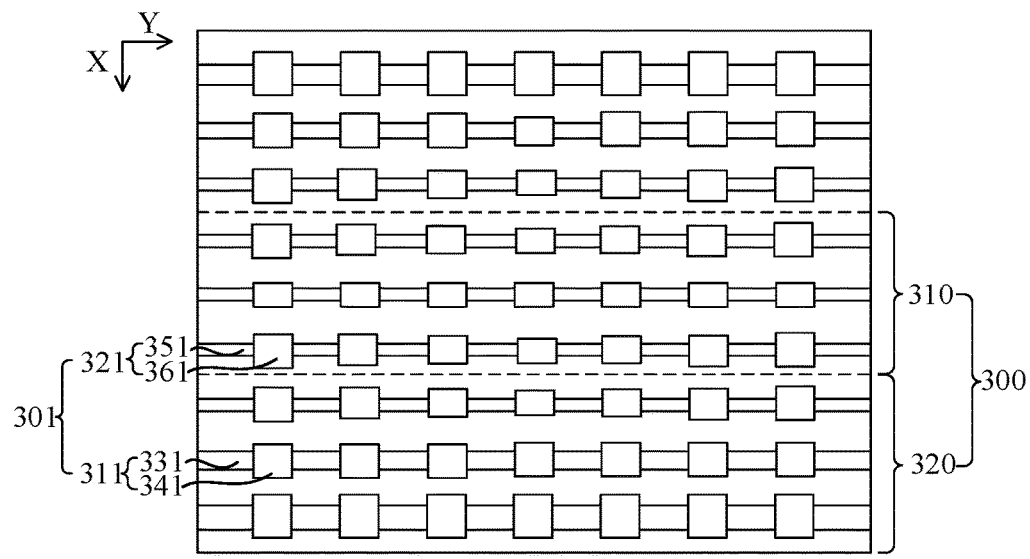
FIG. 10 is a top view of a tenth solar cell provided according to an embodiment of the present application.

Referring to FIG. 10, which is a schematic diagram of the top view of a tenth solar cell provided according to an embodiment of the present application. In some embodiments, at least one the first body portions 331 in the same column of the columns gradually increases in size along the first direction or the direction opposite to the first direction X. In some embodiments, the welding strips not only in contact with and connect to the first widened portion 341, but also in contact with and connect to a part of the first body portion 331. Therefore, at least one the first body portions 331 in the same column of the columns gradually increases in size, which can increase the reliability of the connection between the welding strips and the first finger electrodes 311.

It can be understood that the gradual increase in size of at least one of the first body portions 331 here can refer to the increase in size of all the first body portions 331 along the first direction or the direction opposite to the first direction X. For example, the number of first body portions 331 is three, where the three first body portions 331 are named as a first of first body portion, a second of first body portion, and a third of first body portion along the second direction Y or the direction opposite to the second direction Y. The size of the first of first body portion is smaller than that of the second of first body portion, and the size of the second of first body portion is smaller than that of the third of first body portion. At least one of the first body portions 331 gradually increases in size, which can also refer to only a part of the first body portions 331 gradually increases in size. Similarly, the number of first body portions 331 is three. For example, the size of the first of first body portion is smaller than the size of the second of first body portion, the size of the second of first body portion is equal to the size of the third of first body portion, or the size of the first of first body portion is equal to the size of the second of first body portion, and the size of the second of first body portion is smaller than the size of the third of first body portion.

In some embodiments, the first widened portions 341 and/or the second widened portions 361 have a rectangular shaped, an elliptical shaped, or a wave shaped orthographic projections on the substrate 300. For rectangular shaped and elliptical shaped orthographic projections, regular shapes can facilitate the production process of the first widened portions 341 and the second widened portions 361, thereby reducing the difficulty of forming the solar cell. For the wave shaped orthographic projections, the first widened portions 341 with the wave shaped orthographic projections can increase the contact area with the welding strip while reducing the amount of material required to form the finger electrodes 301.

In some embodiments, the number of first finger electrodes 311 on one side of the second finger electrode 321 is 2 to 10, such as 3, 5, 7, or 9. It can be understood that the more the number of first finger electrodes 311, the larger the area of the peripheral region 320, the fewer the number of first finger electrodes 311, and the smaller the area of the peripheral region 320. By setting the number of first finger electrodes 311 on one side of the second finger electrode 321 to 2 to 10, that is, setting the number of finger electrodes 301 with the first widened portion 341 to 2 to 10, the more finger electrodes 301 with the first widened portion 341, the greater the reliability of the connection between the solar cell and the welding strip, the fewer the finger electrodes 301 with the first widened portion 341, and the relatively less slurry required to form the finger electrodes 301. Therefore, by setting the number of first finger electrodes 311 on one side of the second finger electrode 321 to 2 to 10, the reliability of the connection between the solar cell and the welding strip is increased, and the cost of forming the solar cell is also considered.

In some embodiments, the maximum size of the first widened portion 341 along the first direction X is 0.05 mm to 0.8 mm, such as 0.1 mm, 0.3 mm, or 0.5 mm, etc. It can be understood that the larger the maximum size of the first widened portion 341, the higher the reliability of the connection with the welding strip. However, the larger the maximum size, the higher the possibility of interconnection between adjacent finger electrodes 301. Therefore, by setting the maximum size of the first widened portion 341 along the first direction to 0.05 mm to 0.8 mm, it is possible to increase the reliability of the connection with the welding strip while creating a certain gap between adjacent finger electrodes 301.

It should be noted that the maximum size of the first widened portion 341 along the first direction X can refer to the maximum projection size of any two points on the first widened portion 341 along the first direction X.

In some embodiments, the maximum size of the first widened portion 341 along the second direction Y is 0.5 mm to 1.6 mm, such as 0.7 mm, 0.9 mm, 1.1 mm, or 1.3 mm. The larger the maximum size of the first widened portion 341, the greater the space for connecting the first widened portions 341 to the welding strips, and the less difficult it is to align the welding strips. However, the larger the maximum size of the first widened portion 341, the more materials need to be used, that is, the more cost. Therefore, the maximum size of the first widened portion 341 along the second direction Y is 0.5 mm to 1.6 mm, which can increase the space for connecting with the welding strip while reducing the cost of forming finger electrodes 301.

It should be noted that the maximum size of the first widened portion 341 along the second direction Y can refer to the maximum projection size of any two points on the first widened portion 341 along the second direction Y.

In the solar cell provided according to the embodiments of the present application, the first finger electrode 311 includes first body portions 341 and first widened portions 331 arranged alternatingly along the second direction Y. The first widened portion 341 refers to a part where the solar cell is connected to the welding strip corresponding to a cell string when connecting the solar cell to form the cell string. By arranging the orthographic projections of the first widened portion 341 on the substrate 300 to be larger than the orthographic projections of the first body portion 331 on the substrate, the reliability of the connection between the first finger electrode 311 and the welding strip can be increased. Similarly, for the second finger electrode 321, the second widened portion 361 can also increase the reliability of the connection between the second finger electrode 321 and the welding strip. Moreover, for the solar cell, the probability of failure between the first finger electrode 311 arranged in the peripheral region 320 and the welding strip is greater than that of failure between the second finger electrode 321 arranged in the central region 310 and the welding strip. Therefore, it is also set that the orthographic projections of the first widened portion 341 on the substrate 300 is larger than the orthographic projections of the second widened portion 361, which can further improve the reliability of the connection between the first finger electrode 311 arranged in the peripheral region 320 and the welding strip. In addition, the probability of failure in the connection between the first finger electrode 311 farthest from the central region 310 and the welding strip is greater than that of the connection between the first finger electrode 311 closest to the central region 310 and the welding strip. Therefore, it is also set that the orthographic projections of the first widened portion 341 of the first finger electrode 311 farthest from the central region 310 on the substrate 300 is larger than the orthographic projections of the first widened portion 341 of the first finger electrode 311 closest to the central region 310 on the substrate 300, which can further improve the reliability of the connection between the solar cell and the welding strip.

A photovoltaic module is further provided according to another embodiment of the present application, and the photovoltaic module includes the solar cell according to above embodiments. The following will explain the photovoltaic module provided according to another embodiment of the present application in conjunction with the accompanying drawings. It is necessary to note that the same or corresponding parts of the above embodiments can be referred to in the corresponding explanation of the above embodiments, which will not be elaborated below.

Figure 11:
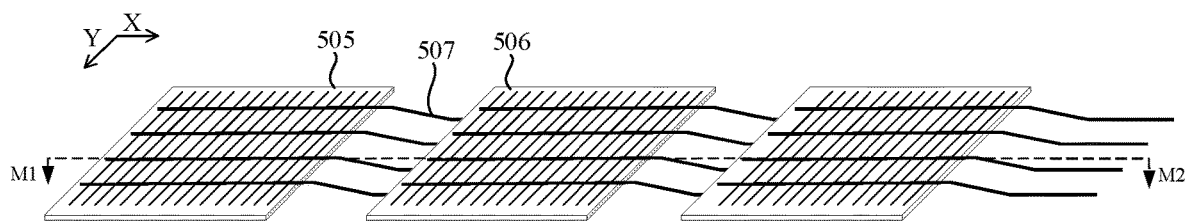
FIG. 11 is a three-dimensional view of a first photovoltaic module provided according to an embodiment of the present application.
Figure 12:
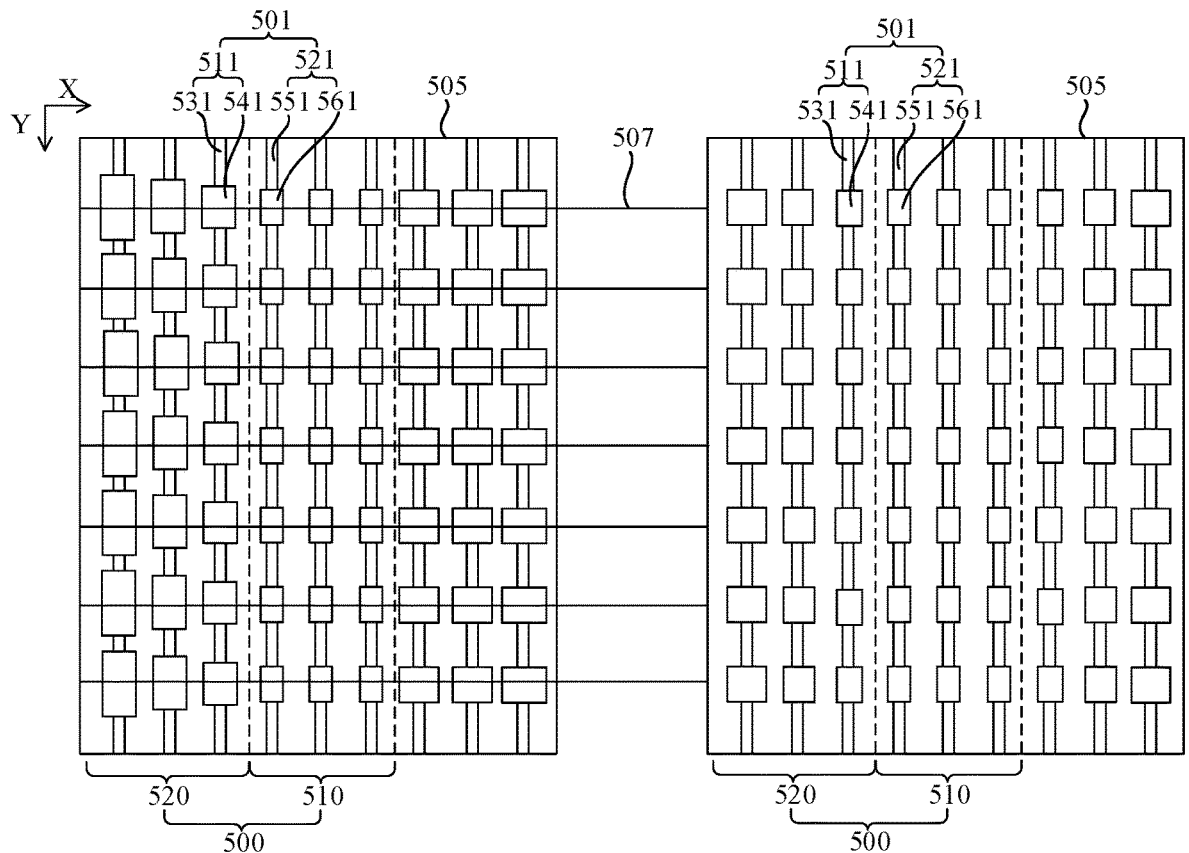
FIG. 12 is a top view of the first photovoltaic module provided according to an embodiment of the present application.
Figure 13:
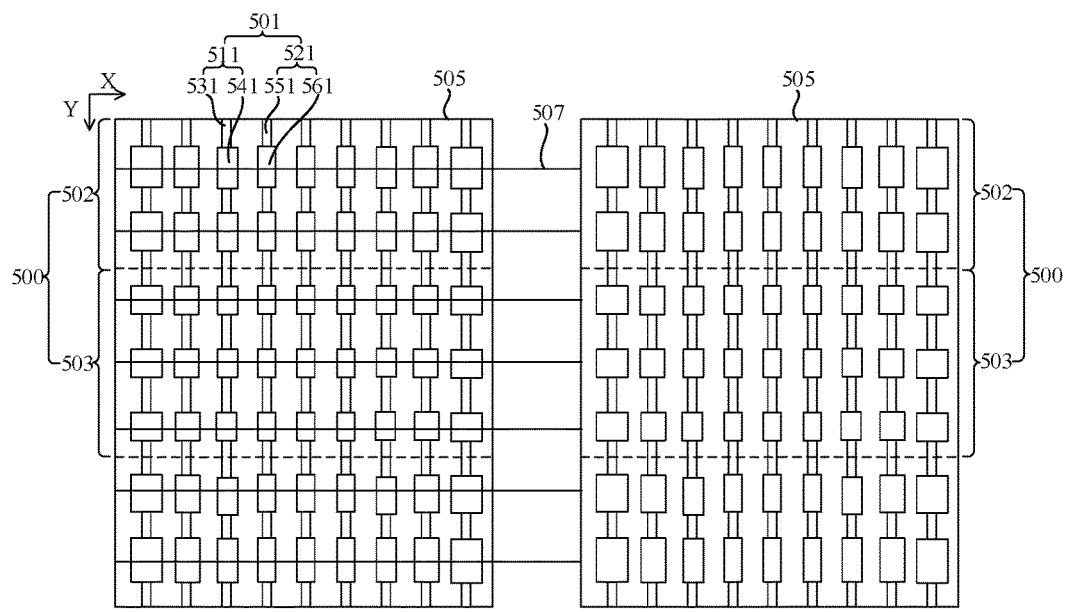
FIG. 13 is a top view of a second photovoltaic module provided according to an embodiment of the present application.
Figure 14:
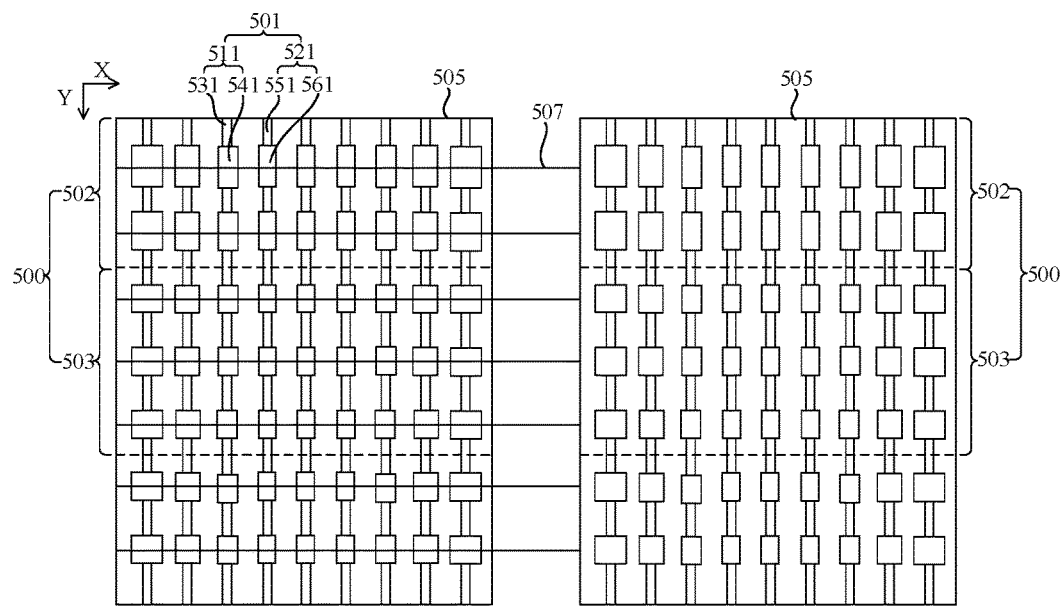
FIG. 14 is a top view of a third photovoltaic module provided according to an embodiment of the present application.
Figure 15:
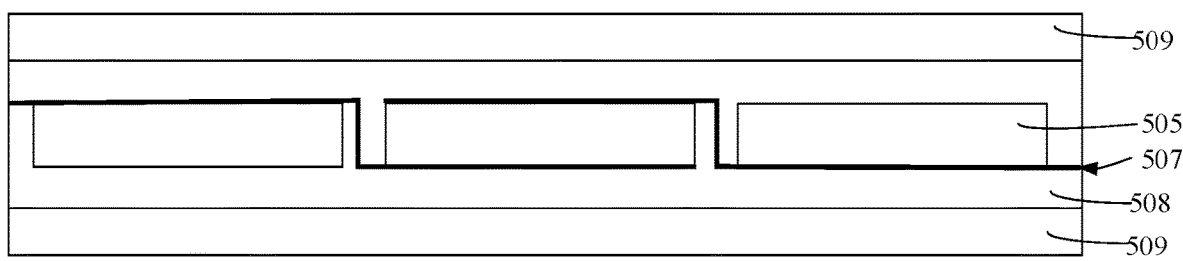
FIG. 15 is a cross-sectional view of the first photovoltaic module provided according to an embodiment of the present application.

Referring to FIG. 11 to FIG. 15, FIG. 11 is a three-dimensional view of a first photovoltaic module provided according to an embodiment of the present application. FIG. 12 is a top view of the first photovoltaic module provided according to an embodiment of the present application. FIG. 13 is a top view of a second photovoltaic module provided according to an embodiment of the present application. FIG. 14 is a top view of a third photovoltaic module provided according to an embodiment of the present application. FIG. 15 is a cross-sectional view of the first photovoltaic module provided according to another embodiment of the present application along dash line M1-M2.

Referring to FIG. 11, FIG. 12, and FIG. 15, a photovoltaic module is further provided according to another embodiment of the present application, and the photovoltaic module includes: a cell string including edge cells 505 arranged close to edges of the photovoltaic module and a central cell 506, each of the edge cells 505 includes a substrate 500 having a central region 510 and two peripheral regions 520 formed on two opposite sides of the central region 510 along a first direction X, respectively, and multiple finger electrodes 501 are arranged at intervals along the first direction X. The multiple finger electrodes 501 are arranged on a surface of the substrate 500 and extend along a second direction Y, and the multiple finger electrodes 501 include multiple first finger electrodes 511 arranged in the two peripheral regions 520 and multiple second finger electrodes 521 arranged in the central region 510. A respective first finger electrode 511 of the multiple first finger electrodes 511 includes first body portions 531 and first widened portions 541 arranged alternatingly along the second direction Y, a respective second finger electrode 521 of the multiple second finger electrodes 521 includes second body portions 551 and second widened portions 561 arranged alternatingly along the second direction Y, and the first widened portions 541 are arranged and aligned to the second widened portions 561 along the first direction X. The first widened portions 541 have larger orthographic projections on the substrate 500 than the second widened portions 561, the first widened portions 541 have larger orthographic projections on the substrate 500 than the first body portions 531, the second widened portions 561 have larger orthographic projections on the substrate 500 than the second body portions 551, and a respective first widened portion 541 of a respective first finger electrode 511 in two first finger electrodes 511 farthest from the central region 510 has a larger orthographic projection on the substrate 500 than a respective first widened portion 541 of a first finger electrode 511 arranged in a middle of the central region 510. The photovoltaic module further includes welding strips 507 arranged at intervals along the second direction Y and extending along the first direction X, a respective welding strip 507 in the multiple welding strips 507 is in contact and connected to the first widened portions 541 and the second widened portions 561 in a same respective column to connect two adjacent cells.

The photovoltaic modules provided according to the embodiments of the present application further includes at least one encapsulation adhesive film 508 configured to cover the at least one cell string.

The photovoltaic module provided according to the embodiments of the present application further includes at least one cover plate 509 configured to cover the at least one encapsulation adhesive film 508.

The photovoltaic module provided according to the embodiments of the present application includes at least one cell string including edge cells 505 and a central cell 506. Compared to the central cell 506, the reliability of the edge cells 505 is relatively low. Therefore, by setting the edge cells 505 to include first body portions 531 and first widened portions 541, and the first widened portions 541 have larger orthographic projections on the substrate 500 than the first body portions 531, the reliability of the connection between the first finger electrode 511 and the welding strip 507 can be increased. Moreover, for the edge cells 505, the probability of failure between the first finger electrode 511 arranged in the peripheral region 520 and the welding strip is greater than that of failure between the second finger electrode 521 arranged in the central region 510 and the welding strip. Therefore, it is also set that the orthographic projections of the first widened portion 541 on the substrate 500 is larger than the orthographic projections of the second widened portion 561, which can further improve the reliability of the connection between the first finger electrode 511 arranged in the peripheral region 520 and the welding strip. In addition, the probability of failure in the connection between the first finger electrode 511 farthest from the central region 510 and the welding strip is greater than that of the connection between the first finger electrode 511 closest to the central region 510 and the welding strip. Therefore, it is also set that the orthographic projections of the first widened portion 541 of the first finger electrode 511 farthest from the central region 510 on the substrate 500 is larger than the orthographic projections of the first widened portion 541 of the first finger electrode 511 closest to the central region 510 on the substrate 500, which can further improve the reliability of the connection between the edge cells 505 and the welding strips 507, and thereby improving the reliability of the photovoltaic module.

In some embodiments, edge cells 505 may be the two or four outermost edge cells in a cell string. The outermost edge cells here can refer to the several outermost edge cells along the second direction Y of the cell string. The central cell 506 is a cell arranged between edge cells 505, and the structure of the central cell 506 is the same as that of the edge cells 505. Reference may be made to the corresponding structures shown in FIG. 1 and FIG. 2 and related explanations, which will not be repeated here.

In some embodiments, each of the at least one encapsulation adhesive film 508 includes a first encapsulation layer (not shown) and a second encapsulation layer (not shown), where the first encapsulation layer is configured to cover one of a front surface or a rear surface of the solar cell, and the second encapsulation layer is configured to cover the other of the front surface or the rear surface of the solar cell. Specifically, at least one of the first encapsulation layer or the second encapsulation layer is an organic encapsulation adhesive film, such as a polyvinyl butyral (PVB) film, an ethylene vinyl acetate copolymer (EVA) film, a polyolefin thermoplastic elastomer (POE) film, or a polyethylene glycol terephthalate (PET) film.

It can be understood that the first encapsulation layer and the second encapsulation layer have a boundary before the lamination process. After the lamination process, the concept of the first encapsulation layer and the second encapsulation layer will no longer exist in the formed photovoltaic module, that is, the first encapsulation layer and the second encapsulation layer have formed a complete encapsulation adhesive film 508.

In some embodiments, each of the at least one cover plate 509 may be a glass cover plate, a plastic cover plate, or other cover plates with transparent functions. Specifically, a surface of each of the at least one cover plate 509 facing toward the at least one encapsulation adhesive film 508 is a surface with protrusions and recesses, thereby increasing the utilization of incident light. The at least one cover plate 509 includes a first cover plate and a second cover plate, the first cover plate is arranged opposite to the first encapsulation layer and the second cover plate is arranged opposite to the second encapsulation layer.

Referring to FIG. 12, in some embodiments, the first widened portions 541 of each respective first finger electrode 511 of a respective edge cell 505 closest to the central cell 506 have smaller orthographic projections on the substrate 500 than the first widened portions 541 of the first finger electrodes 511 of a respective edge cell 505 farthest away from the central cell 506. For the edge cells 505, there is a side close to the central cell 506 and a side away from the central cell. Naturally, there is a first finger electrode 511 close to the central cell 506 and a first finger electrode 511 away from the central cell 506. Compared to the first finger electrode 511 close to the central cell 506, the first finger electrode 511 away from the central cell 506 has a higher probability of failure in connection with the welding strip. Therefore, by setting the first widened portions 541 of the first finger electrode 511 away from the central cell 506 to have larger orthographic projections on the substrate 500, the reliability of the connection between the first finger electrode 511 away from the central cell 506 and the welding strip 507 can be increased.

In some embodiments, along the second direction Y or a direction opposite to the second direction Y, at least one of the first widened portions 541 of each respective first finger electrode 511 of a respective edge cell 505 closest to the central cell 506 has a larger orthographic projection on the substrate 500 than some of the first widened portions 541 in a same column of the columns along the first direction X of each respective first finger electrodes 511 of two edge cells 505 closest to the central cell 506.

In other words, for one side of the cell string including multiple edge cells 505, there naturally exist edge cells 505 close to the central cell 506 and edge cells 505 relatively away from the central cell 506. Compared to edge cells 505 away from the central cell 506, edge cells 505 close to the central cell 506 have relatively higher reliability in connecting to the welding strip 507. The orthographic projection area of at least one the first widened portion 541 of the edge cell 505 farthest from the central cell 506 on the substrate 500 is defined as a first area, and the orthographic projection area of at least one the first widened portions 541 of the edge cell 505 closest to the central cell 506 in the same column of the columns along the first direction X on the substrate 500 is defined as a second area. By setting the first area to be greater than the second area, the reliability of the connection between the relatively more edge cells 505 and the welding strips 507 can be increased.

It should be noted that for the solar cell, the first widened portions 541 and the second widened portions 561 are arranged in a column along the first direction X, and for the cell string, the solar cells are also arranged along the first direction X. Therefore, there is not only the first widened portions 541 and the second widened portions 561 of one solar cell arranged in a column along the first direction X. By setting at least one of the first widened portions 541 of each respective first finger electrode 511 of a respective edge cell 505 closest to the central cell 506 has a larger orthographic projection on the substrate 500 than some of the first widened portions 541 in a same column of the columns along the first direction X of each respective first finger electrodes 511 of two edge cells 505 closest to the central cell 506, the reliability of the connection between the edge cells 505 and the welding strips 507 can be increased.

In some embodiments, at least one of the first widened portions 541 may refer to: all first widened portions 541 in the edge cell 505 farthest from the central cell 506 have larger orthographic projections on the substrate 500 than all first widened portions 541 in the edge cell 505 closest to the central cell 506. At least one of the first widened portions 541 may also refer to: the first widened portions 541 on the first finger electrode 511 farthest from the central cell 506 in the edge cell 505 farthest to the central cell 506 have larger orthographic projections on the substrate 500 than the first widened portions 541 on the first finger electrode 511 farthest from the central cell 506 in the edge cell 505 closest to the central cell 506. At least one of the first widened portions 541 may also refer to: any first widened portion 541 in the edge cell 505 farthest from the central cell 506 has a larger orthographic projection on the substrate 500 than any first widened portion 541 in the edge cell 505 closest to the central cell 506.

In some embodiments, any of the first widened portions 541 of each respective first finger electrodes 511 of a respective edge cell 505 farthest from the central cell 506 has a larger orthographic projection on the substrate 500 than any of the first widened portions 541 in a same column of the columns along the first direction X of each respective first finger electrodes 511 of a respective edge cell 505 closest to the central cell 506. In other words, in the same column of the columns, all first widened portions 541 of the edge cell 505 farthest from the central cell 506 have larger orthographic projections on the substrate 500 than all first widened portions 541 of the edge cell 505 closest to the central cell 506, thereby further improving the reliability of connection in the photovoltaic module.

Referring to FIG. 13, in some embodiments, the photovoltaic module includes two first regions 502 and a second region 503, and the two first regions 502 are arranged on opposite sides of the second region 503 along the second direction Y, respectively. It can be understood that the two first regions 502 belong to the peripheral part of the photovoltaic module compared to the second region 503. In addition, the first widened portions 541 of a respective first region 502 farthest from the second region 503 have larger orthographic projections on the substrate 500 than the first widened portions 541 of the respective first region 502 closest to the second region 503 and in the same row along the second direction Y. In other words, for the solar cell, the orthographic projection area of the first widened portions 541 on the substrate 500 in the same first finger electrode 511 is different. The first widened portion 541 closest to the second region 503 on the substrate 500 has a smaller orthographic projection on the substrate 500 than the first widened portion 541 farthest from the first region 502.

By setting the first widened portion 541 closest to the second region 503 on the substrate 500 to have a smaller orthographic projection on the substrate 500 than the first widened portion 541 farthest from the first region 502, the reliability of the connection between the welding strip 507 and the finger electrode 501 in the photovoltaic module can be further improved.

In some embodiments, the second widened portion 561 in the first region 502 farthest from the second region 503 has a larger orthographic projection on the substrate 500 than the second widened portion 561 in the same first region 502 closest to the second region 503 and in the same row along the second direction Y. In other words, for the solar cell, the orthographic projection area of the second widened portions 561 in the same second finger electrode 521 on the substrate 500 is different. The second widened portion 561 closest to the second region 503 has a smaller orthographic projection on the substrate 500 than the second widened portion 561 farthest from the first region 502.

In some embodiments, along the second direction Y or the direction opposite to the second direction Y, at least one the first widened portions 541 on the same first finger electrode 511 in the first region 502 gradually increases in the orthographic projection area on the substrate 500, and/or, at least one of the second widened portions 561 on the same second finger electrode 521 in the first region 502 gradually increases in the orthographic projection area on the substrate 500.

It should be noted that the variation in the orthographic projection area here can refer to the variation in the orthographic projection area of the first widened portion of the edge region in the solar cell mentioned above, which will not be repeated here.

In some embodiments, the photovoltaic module includes multiple cell strings. Referring to FIG. 11, the multiple cell strings are arranged along the second direction Y in FIG. 11. For multiple cell strings, there are edge cell strings and a central cell string, and the edge cell strings naturally has a side close to the central cell string and a side away from the central cell string. Combining with reference from FIG. 14, which is a top view of a third photovoltaic module provided according to an embodiment of the present application. FIG. 14 shows an edge cell string, and the edge cell string includes a first region 502 on a side away from the central cell string, a second region 503, and a first region 502 on the other side close to the central cell string. In some embodiments, the average orthographic projection area of the first widened portions 541 of the first region 502 away from the central cell string on the substrate 500 is larger than the average orthographic projection area of the first widened portions 541 of the first region 502 close to the central cell string on the substrate 500. The first region 502 away from the central cell string belongs to a part closer to the edges of the photovoltaic module. Therefore, the reliability of the photovoltaic module can be further improved by setting the average orthographic projection area of the first widened portions 541 of the first region 502 away from the central cell string on the substrate 500 to be larger than the average orthographic projection area of the first widened portions 541 of the first region 502 close to the central cell string on the substrate 500. In other words, the first widened portions 541 in the first region 502 on two opposite sides of the second region 503 is at least partially different in morphology.

In some embodiments, the average orthographic projection area of the second widened portions 561 of the first region 502 on the substrate 500 away from the side of the central cell string is larger than the average orthographic projection area of the second widened portions 561 of the first region 502, which can further improve the reliability of the photovoltaic module.

In some embodiments, the average orthographic projection area of the first widened portions 541 in the second region 503 on the substrate 500 is equal to the average orthographic projection area of the first widened portions 541 in the first region 502 close to the side of the central cell string. The average orthographic projection area of the second widened portions 561 in the second region 503 on the substrate 500 is equal to the average orthographic projection area of the second widened portions 561 in the first region 502 close to the central cell string.

Furthermore, the orthographic projection area of the first widened portions 541 in the second region 503 on the substrate 500 is equal to the orthographic projection area of the first widened portions 541 in the same finger electrode 511 in the first region 502 close to the central cell string. The orthographic projection area of the second widened portions 561 in the second region 503 on the substrate 500 is equal to the orthographic projection area of the second widened portions 561 in the same second finger electrode 521 in the first region 502 close to the central cell string.

It can be understood that the orthographic projection area is related to the size of the first widened portion 541 along the first direction X and the size of the first widened portion 541 along the second direction Y. Reference of corresponding description may be made to the corresponding description of the first widened portion in the solar cell mentioned above. Similarly, the size of the second widened portion 561 along the first direction X and the size of the second direction Y can refer to the corresponding description of the second widened portion in the solar cell mentioned above.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Those of ordinary skill in the art can understand that the above embodiments are specific embodiments of the present application, and in practical applications, various changes may be made in form and details without deviating from the spirit and scope of the present application. Any one of ordinary skills in the art may make various changes and modifications without departing from the spirit and scope of the present application. Therefore, the scope of protection of the present application shall be subject to the scope limited by the claims.

What is claimed is:

1. A photovoltaic module, comprising:
    a cell string including edge cells arranged close to edges of the photovoltaic module and a central cell, wherein each of the edge cells includes:
    a substrate having a central region and two peripheral regions on two opposite sides of the central region, respectively; and
    a plurality of finger electrodes arranged at intervals along a first direction and including first finger electrodes and second finger electrodes, wherein each of the two peripheral regions has at least two first finger electrodes in the first finger electrodes, and the second finger electrodes are arranged in the central region, wherein the plurality of finger electrodes are arranged on a surface of the substrate and each of the plurality of finger electrodes extends along a second direction, the central region and the two peripheral regions are arranged along the first direction, and a boundary between the central region and each of the two peripheral regions extends along the second direction;
    wherein each of the first finger electrodes includes first body portions and first widened portions arranged alternatingly along the second direction, each of the second finger electrodes includes second body portions and second widened portions arranged alternatingly along the second direction, and the first widened portions are respectively aligned to the second widened portions along the first direction to form columns;
    wherein each of the first widened portions of any of the first finger electrodes has a larger orthographic projection on the substrate than each of the second widened portions of any the second finger electrodes, each of the first widened portions of any the first finger electrodes has a larger orthographic projection on the substrate than each of the first body portions of any the first finger electrodes, each of the second widened portions of any the second finger electrodes has a larger orthographic projection on the substrate than each of the second body portions of any the second finger electrodes, and along the first direction, a respective first widened portion of either one of two first finger electrodes farthest from the central region has a larger orthographic projection on the substrate than a respective first widened portion of each of two first finger electrodes arranged closet to the central region;
    a plurality of welding strips arranged at intervals along the second direction and extending along the first direction, wherein a respective welding strip in the plurality of welding strips is in contact and connected to the first widened portions and the second widened portions in a same respective column to connect two adjacent cells;
    at least one encapsulation adhesive film configured to cover at least one cell string; and at least one cover plate configured to cover the at least one encapsulation adhesive film,
wherein the edge cells include a first edge cell closest to the central cell and a second edge cell farthest away from the central cell, and wherein each of the first widened portions of each respective first finger electrode of the first edge cell has an orthographic projection on the substrate of the first edge cell that is smaller than an orthographic projection of each of the first widened portions of the first finger electrodes of the second edge cell on the substrate of the second edge cell.

2. The photovoltaic module according to claim 1, wherein along the second direction or a direction opposite to the second direction, at least one of the first widened portions of each respective first finger electrode of the first edge cell has a larger orthographic projection on the substrate of the first edge cell than some of the first widened portions in a same column of the columns along the first direction of each respective first finger electrodes of two edge cells closest to the central cell.

3. The photovoltaic module according to claim 1, wherein any of the first widened portions of each respective first finger electrodes of the second edge cell has a larger orthographic projection on the substrate of the second edge cell than any of the first widened portions in a same column of the columns along the first direction of each respective first finger electrodes of the first edge cell.

4. The photovoltaic module according to claim 1, the cell string as a whole including two first regions and a second region, wherein the two first regions are arranged on opposite sides of the second region along the second direction, respectively.

5. The photovoltaic module according to claim 4, wherein the first widened portions of a respective first region farthest from the second region have larger orthographic projections on a plane where the substrate of each of the edge cells lies in than the first widened portions of the respective first region closest to the second region and in a same row along the second direction.

6. The photovoltaic module according to claim 4, wherein the second widened portion in the first region farthest from the second region has a larger orthographic projection on a plane where the substrate of each of the edge cells lies in than the second widened portion in the same first region closest to the second region and in a same row along the second direction.

7. The photovoltaic module according to claim 4, wherein the at least one cell string includes edge cell strings and a central cell string, an average orthographic projection area of first widened portions in the first region away from the central cell string on a plane where the substrate of each of the edge cells lies in is larger than an average orthographic projection area of first widened portions in the first region close to the central cell string on the plane where the substrate of each of the edge cells lies in.

8. The photovoltaic module according to claim 7, wherein an average orthographic projection area of second widened portions in a respective first region of the two first regions away from the central cell string is larger than an average orthographic projection area of second widened portions in respective first region close to the central cell string.

9. The photovoltaic module according to claim 1, wherein at least one of the first widened portions of a respective edge cell of the edge cells in a same column of the columns gradually increases in orthographic projection area on the substrate of the respective edge cell along the first direction or a direction opposite to the first direction.

10. The photovoltaic module according to claim 1, wherein along the first direction or a direction opposite to the first direction, different first widened portions of a respective edge cell of the edge cells in a same column of the columns gradually increases in size along the first direction, and/or different first widened portions of a respective edge cell of the edge cells in the same column of the columns gradually increases in size along the second direction.

11. The photovoltaic module according to claim 1, wherein along the first direction or a direction opposite to the first direction, different first widened portions of a respective edge cell of the edge cells in a same column of the columns have a same size along the second direction, and/or different second widened portions of a respective edge cell of the edge cells in the same column of the columns have a same size along the second direction.

12. The photovoltaic module according to claim 11, wherein a respective first widened portion and a respective second widened portion of the respective edge cell in the same column of the columns have a same size along the first direction.

13. The photovoltaic module according to claim 1, wherein a respective peripheral region in the two peripheral regions of a respective edge cell of the edge cells includes a first sub region and two second sub regions arranged on two opposite sides of the first sub region along the second direction, respectively, and a respective first widened portion in the first sub region is smaller than a respective first widened portion in the two second sub regions in average area.

14. The photovoltaic module according to claim 13, wherein at least one of the first widened portions of a same first finger electrode in the two second sub regions of the respective edge cell gradually increases in size along the second direction or a direction opposite to the second direction.

15. The photovoltaic module according to claim 1, wherein the first body portions of a respective edge cell of the edge cells have a same size as the second body portions of the respective edge cell along the second direction.

16. The photovoltaic module according to claim 1, wherein at least one the first body portions of a respective edge cell of the edge cells in a same column of the columns gradually increases in size along the first direction or a direction opposite to the first direction.

17. The photovoltaic module according to claim 1, wherein the first widened portions and/or the second widened portions of a respective edge cell of the edge cells have a rectangular shaped, an elliptical shaped, or a wave shaped orthographic projections on the substrate of the respective edge cell.

18. The photovoltaic module according to claim 1, wherein there are 2 to 10 first finger electrodes on one of the two peripheral regions of a respective edge cell of the edge cells.

* * * * *